United States Patent [19] [11] Patent Number: 4,538,288
Soneda et al. [45] Date of Patent: Aug. 27, 1985

[54] SHIFT REGISTER CIRCUIT WITH MULTIPLE, TAPPED OUTPUTS HAVING PULL-DOWN TRANSISTORS

[75] Inventors: Mitsuo Soneda; Toshikazu Maekawa; Kouji Otsu, all of Kanagawa, Japan

[73] Assignee: Sony Corporation, Tokyo, Japan

[21] Appl. No.: 528,465

[22] Filed: Sep. 1, 1983

[30] Foreign Application Priority Data

Sep. 8, 1982 [JP] Japan ................ 57-156317

[51] Int. Cl.$^3$ .............. G11C 19/28; H03K 17/06; H03K 19/096
[52] U.S. Cl. ................. 377/76; 307/481; 307/482; 307/269; 377/79; 377/80; 377/117
[58] Field of Search ............ 307/453, 481, 482, 577, 307/578, 269; 377/68, 77–81, 105, 106, 117, 76, 75

[56] References Cited

U.S. PATENT DOCUMENTS

| T91,300 | 8/1983 | Beausoleil | 377/68 |
| 3,794,856 | 2/1974 | Baker | 377/79 |
| 3,983,411 | 9/1976 | Luscher et al. | 377/105 |
| 4,084,106 | 4/1978 | Ullrich | 377/79 |
| 4,295,055 | 10/1981 | Takemoto et al. | 377/79 X |
| 4,316,106 | 2/1982 | Young et al. | 307/481 |
| 4,339,672 | 7/1982 | Sato | 307/482 X |

FOREIGN PATENT DOCUMENTS 2355408 6/1974 Fed. Rep. of Germany ........ 377/79
2923746 12/1979 Fed. Rep. of Germany .

OTHER PUBLICATIONS

Debord et al, "Five-Transistor Shift-Register Cell", IBM Tech Disc Bull, vol. 19, No. 9, Feb. 1977, pp. 3435–3437.

Primary Examiner—Stanley D. Miller
Assistant Examiner—D. R. Hudspeth
Attorney, Agent, or Firm—Lewis H. Eslinger; Alvin Sinderbrand

[57] ABSTRACT

A signal translating circuit is disclosed in which an input signal is supplied to a source follower transistor, a bootstrap capacitive component is presented between the gate and source of the source follower transistor, the signal from the source follower transistor is supplied through a first transmission gate to a next stage, and also led out to an output terminal. Further, the circuit formed of the source follower transistor and the first transmission gate is sequentially connected and the source follower transistor and the first transmission gate are alternately driven with different phases to each other whereby the input signal is sequentially transmitted at each stage. Furthermore, a second transmission gate is connected between the output terminal of the source follower transistor and the ground in which after the output signal at the output terminal rises up and falls down once, the second transmission gate is turned on by the signal relating to the output from the stages following the succeeding stage to thereby make the level of the signal when the output signal at the output terminal falls down stable. Thus, undesired potential fluctuation is not generated on the output line.

5 Claims, 50 Drawing Figures

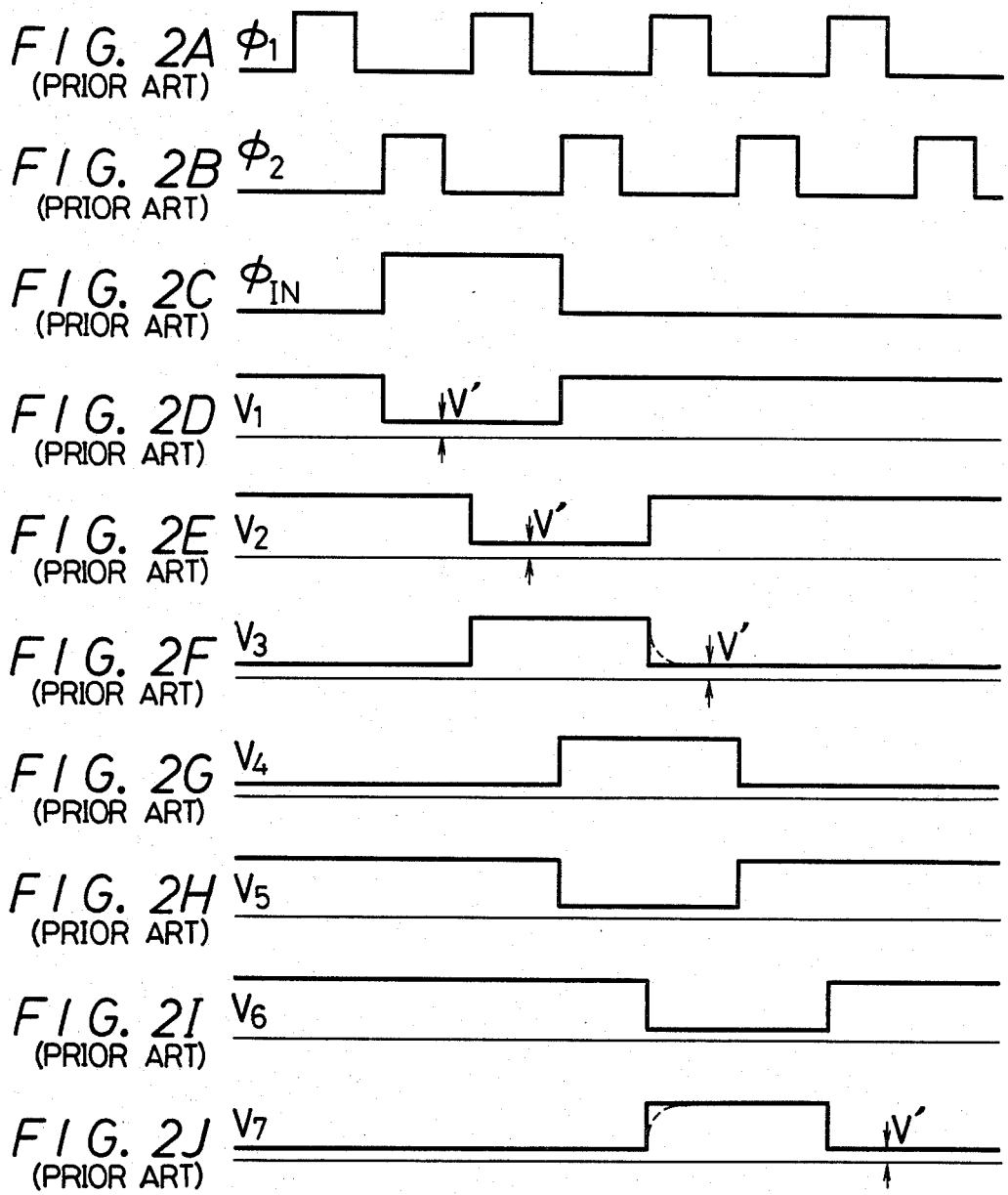

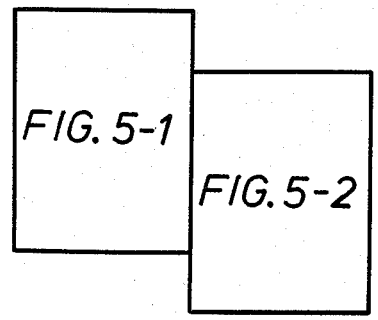
FIG. 5A-1 $V_H$ $V_L$ φ₁
FIG. 5B-1 $V_H$ $V_L$ φ₂
FIG. 5C-1 $V_H$ $V_L$ φ$_{IN}$
FIG. 5D-1 $V_1$ $V_H-V_{th}$ $V_L$ $V_A$
FIG. 5E-1 $V_2$ $V_H$ $V_L$
FIG. 5F-1 $V_3$ $V_A$
FIG. 5G-1 $V_4$
FIG. 5H-1 $\overline{V_5}$ $V_H-V_{th}$ $V_L$
FIG. 5I-1 $V_6$
FIG. 5J-1 $V_7$
FIG. 5K-1 $\overline{V_8}$
FIG. 5L-1 $V_9$
FIG. 5M-1 $V_{10}$
FIG. 5N-1 $\overline{V_{11}}$
FIG. 5O-1 $V_{12}$
FIG. 5P-1 $V_{13}$
FIG. 5Q-1 $\overline{V_{14}}$

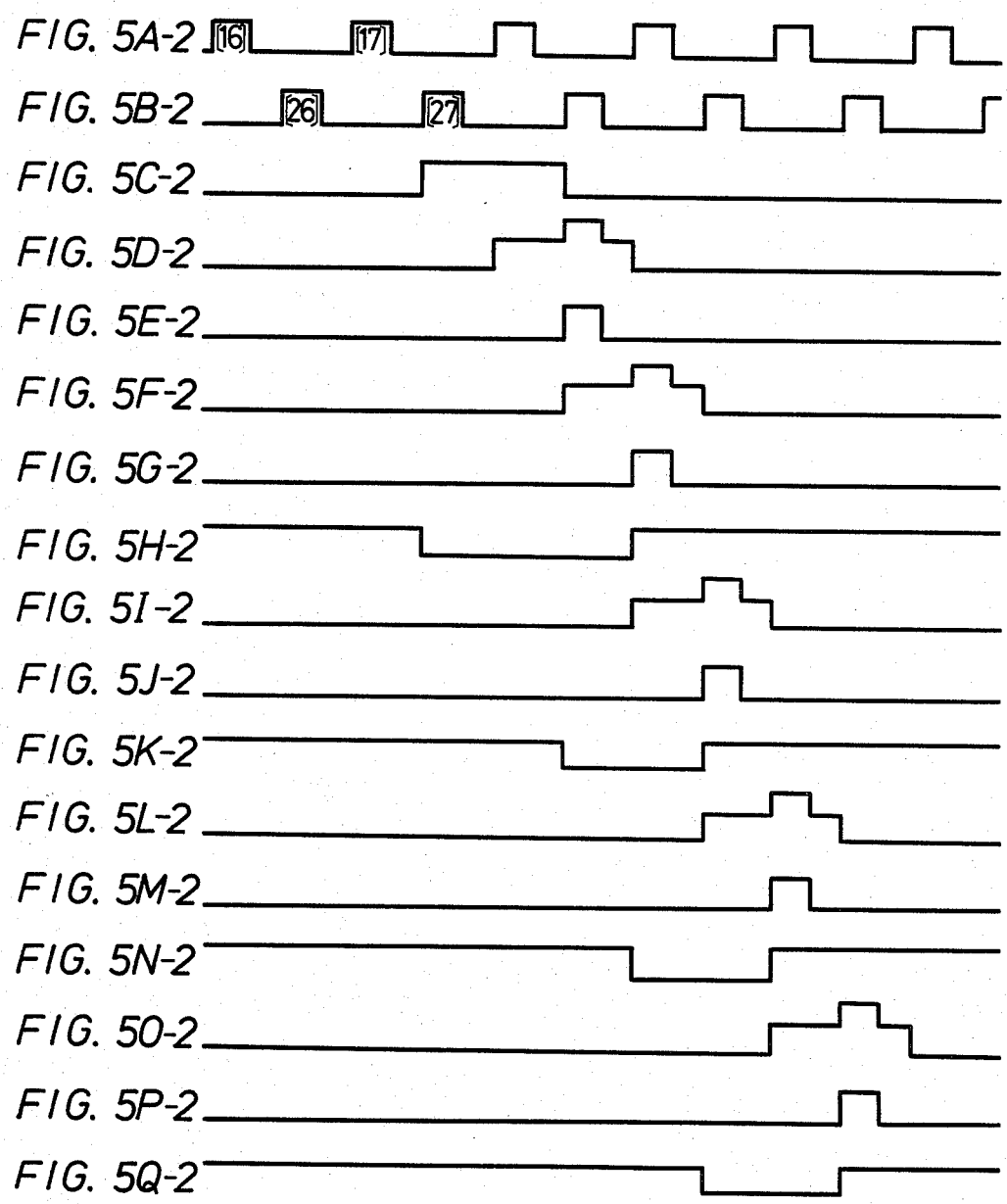

SHIFT REGISTER CIRCUIT WITH MULTIPLE, TAPPED OUTPUTS HAVING PULL-DOWN TRANSISTORS

BACKGROUND OF THE INVENTION

1. Field of the Invention

The present invention relates generally to signal translating circuits and more particularly is directed to a signal translating circuit suitable for use in a scanning or driving circuit for driving a CCD (charge-coupled device) image sensor or imager, a liquid crystal display device, a memory device and so on.

2. Description of the Prior Art

FIG. 1 shows a prior art circuit which has been used as such signal translating circuit.

In FIG. 1, an input terminal 1 is connected to the gate of a MOS (metal oxide semiconductor) transistor $T_1$ of enhancement type. The source of the transistor $T_1$ is connected to a ground line 2 and the drain thereof is connected to the source and the gate of a MOS transistor $T_2$ of depletion type. The drain of the transistor $T_2$ is connected to a power source line 3.

The connection point between the drain of the transistor $T_1$ and the source of the transistor $T_2$ is connected through the source-drain path of a MOS transistor $T_{31}$ of enhancement type which forms a transmission gate to transistors $T_{41}$ and $T_{51}$ which are connected to each other in the same way as in the transistors $T_1$ and $T_2$. The connection point between the transistors $T_{41}$ and $T_{51}$ is connected through the source-drain path of a MOS transistor $T_{61}$ of enhancement type which forms a transmission gate to transistors $T_{71}$ and $T_{81}$ which are connected in the same way as in the transistors $T_1$ and $T_2$.

The circuit formed of the transistors $T_{31}$ to $T_{81}$ is repeatedly connected in turn. In the figure, the upper numeral of reference letter T is used common and the lower number thereof is changed in turn.

Clock terminals 4 and 5 to which clock signal $\phi_1$ and $\phi_2$ different in phase are applied are respectively connected to gates of the transistors $T_{31}$, $T_{32}$ . . . and $T_{61}$, $T_{62}$ . . . .

In this circuit, the clock signals $\phi_1$ and $\phi_2$ as shown in FIGS. 2A and 2B are respectively supplied to the clock terminals 4 and 5, while a signal $\phi_{IN}$ as, for example, shown in FIG. 2C is supplied to the input terminal 1.

Thus, an inverted voltage $V_1$ as shown in FIG. 2D appears at the connection point 1 between the transistors $T_1$ and $T_2$.

The inverted signal $V_1$ is then sampled by the clock signal $\phi_1$ and held in the gate 2 the transistor $T_{41}$ so that a voltage $V_2$ as shown in FIG. 2E appears thereat. Thus, an inverted voltage $V_3$ as shown in FIG. 2F appears at the connection point 3 between the transistors $T_{41}$ and $T_{51}$. This inverted voltage $V_3$ drives, for example, the first horizontal scanning line.

Further, the inverted voltage $V_3$ is sampled by the clock signal $\phi_2$ and then held in the gate the transistor $T_{71}$, resulting in a voltage $V_4$ as shown in FIG. 2G thereat. Thus, voltages $V_5$, $V_6$ and $V_7$ as shown in FIGS. 2H, 2I and 2J appear respectively at the connection point 5 between the transistors $T_{71}$ and $T_{81}$, the gate 5 of the transistor $T_{42}$ and the connection point 7 between the transistors $T_{42}$ and $T_{52}$. The voltage $V_7$ thus generated drives the second horizontal scanning line. The above operation is sequentially performed hereinbelow.

Assume that the threshold value of the transistors $T_{31}$, $T_{61}$ . . . each forming the transmission gate is $V_{th}$. Then, if the condition of V ($\phi_1$, $\phi_2$) p$-$p$\geq V_{DD}+V_{th}$ (where $V_{DD}$ represents the voltage of the power source line 3) is satisfied, a signal is transmitted through the transmission gate.

In this way, the input signal $\phi_{IN}$ is sequentially transmitted to drive each horizontal scanning line in turn.

The above circuit, however, requires six transistors for constructing one stage by which the signal is transmitted and the succeeding signal is produced. For this reason, the circuit becomes large in size, and particularly when the circuit is formed as an IC (integrated circuit), the chip area is increased, resulting in a problem such as the increased manufacturing cost of IC and so on. More specifically, since in the above circuit the signals are respectively inverted by the transistors $T_{41}$, $T_{51}$ and $T_{71}$, $T_{81}$, the transistors of the doubled number are necessary for providing the signal of the same phase.

Also in the above circuit, when a capacitive load is connected to the output side thereof, the waveforms of the output signals $V_3$ and $V_7$ shown in FIGS. 2F and 2J are blunted as shown by broken lines. In this case, an overlap is caused between the adjacent output signals. Thus, when the above circuit is employed, for example, for the image sensor, its resolution is deteriorated and the picture quality is deteriorated by the mixed color.

Further, since in the above circuit, the transistors $T_2$, $T_{51}$, $T_{81}$ . . . are in the state of being turned on at all times, a through type current flows under the state that the transistors $T_1$, $T_{41}$, $T_{71}$ . . . are turned on, consuming a quite large power.

Moreover, since each transistor is driven in the saturation region, a large power is consumed particularly when the circuit is driven at high speed.

Furthermore, since the transistor elements different in type as enhancement type and depletion type are employed, many manufacturing processes are required when the signal translating circuit is formed as, for example, the integrated circuit.

In addition, in the above circuit, the low levels of the waveforms at the output points 3 , 7 . . . are determined by the ratio of on-resistances between the transistors $T_{41}$, $T_{51}$ and $T_{42}$, $T_{52}$ . . . so that there occurs a residual voltage V' determined as $$V' = \frac{r_1}{r_1 + r_2}(V_{DD} - V_{SS}) + V_{SS}$$

$$= \frac{r_1 V_{DD} + r_2 V_{SS}}{r_1 + r_2}$$

where $r_1$ represents the on-resistance value of the transistors $T_{41}$, $T_{42}$ . . . , $r_2$ that of the transistors $T_{51}$, $T_{52}$ . . . , and $V_{SS}$ the voltage at the ground line 2. In this case, to reduce the residual voltage V', it is sufficient to increase the ratio between the on-resistance values $r_1$ and $r_2$. This means that the chip area of the transistors $T_{41}$, $T_{42}$ . . . must be made larger than that of the transistor $T_{51}$, $T_{52}$ . . . , which fact is not desirable. On the other hand, when the MOS transistor is driven by the output signal, if there is the residual voltage V' as described above, many restrictions are brought about by the threshold value and so on. Furthermore, there is a defect that the dynamic range of the signal is reduced by the amount of the residual voltage V', etc.

OBJECTS AND SUMMARY OF THE INVENTION

Accordingly, it is an object of the present invention to provide a signal translating circuit simple in construction and capable of obviating the aforesaid defects inherent in the conventional signal translating circuit.

Another object of the present invention is to provide a signal translating circuit which can remove the undesired potential fluctuation except the output pulse of the output line.

A further object of the present invention is to provide a signal translating circuit which is suitable for being formed as an integrated circuit with ease and at low cost.

According to one aspect of the present invention, there is provided a signal translating circuit for generating plural pulse outputs, the pulse positions of said outputs being shifted time sequentially, said signal translating circuit comprising:

(A) an input terminal supplied with an input signal;

(B) first and second clock terminals supplied with first and second clock signals respectively, said first and second clock signals having different phases from each other;

(C) plural translating stages connected in series to said input terminal, each stage including a source follower transistor having a gate, a source and a drain, said drain being connected to one of said first and second clock terminals, a capacitor operating as a bootstrap capacitor being formed between said gate and source;

(D) a transmission gate transistor having a gate, a source and a drain, the drain of said transmission gate transistor being connected to the source of the source follower transistor, and the source of said transmission gate transistor being connected to the gate of the source follower transistor of a succeeding stage;

(E) plural output terminals where said plural pulse outputs are obtained connected to the sources of the source follower transistors; and (F) means for connecting said first clock terminal to the drains of said source follower transistors of every other stages and for connecting said second clock terminal to the drains of said source follower transistors of other stages.

The other objects, features and advantages of the present invention will become apparent from the following description taken in conjunction with the accompanying drawings through which the like references designate the same elements and parts.

BRIEF DESCRIPTION OF THE DRAWINGS

FIGS. 2A to 2J are respectively waveform diagrams useful for the explanation thereof;

FIGS. 5A to 5Q are respectively waveform diagrams used to explain the operation of the signal translating circuit shown in FIG. 3.

DESCRIPTION OF THE PREFERRED EMBODIMENTS

Now, the signal translating circuit according to the present invention will hereinafter be described with reference to the attached drawings.

Figure 1:
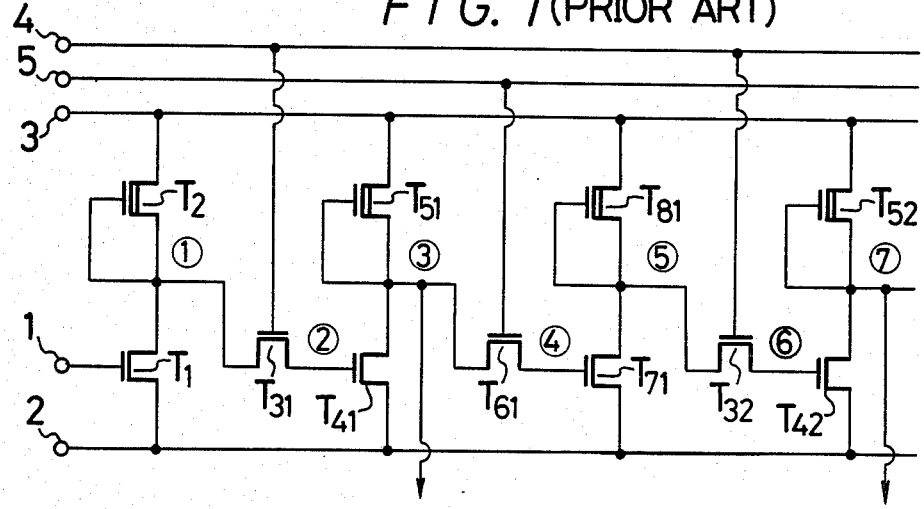
FIG. 1 is a connection diagram of a conventional signal translating circuit.
Figure 3:
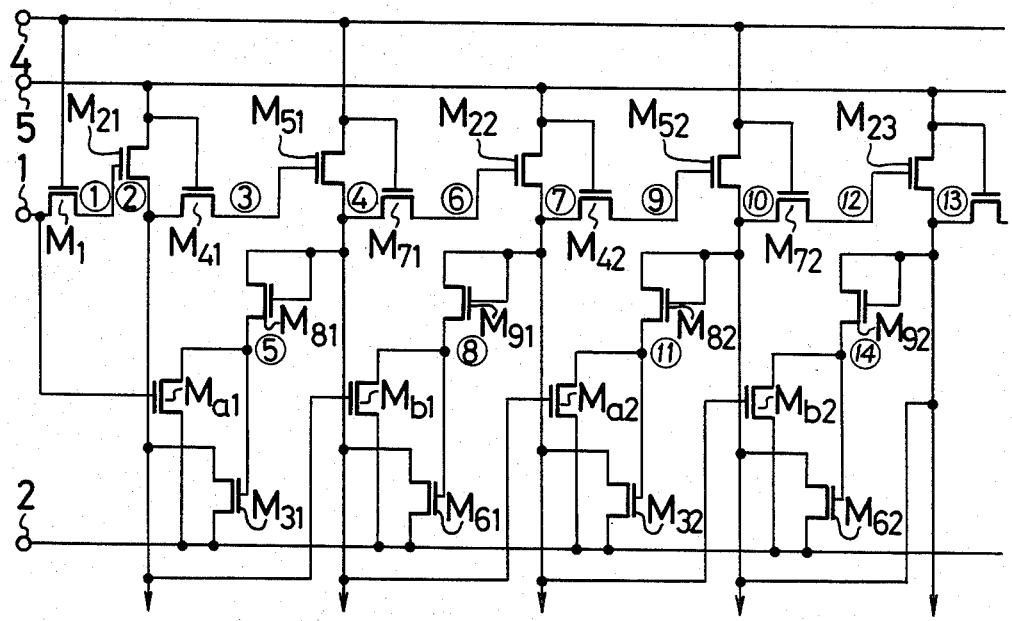
FIG. 3 is a connection diagram showing an embodiment of a signal translating circuit according to the present invention.

FIG. 3 shows an embodiment of the present invention in which, an input terminal 1 is connected through a MOS transistor $M_1$ of enhancement type forming a transmission gate to the gate of a MOS transistor $M_{21}$ of enhancement type formed as a source follower transistor.

Figure 4:
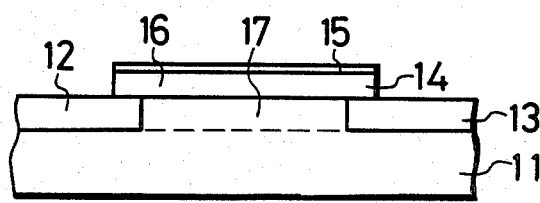
FIG. 4 is a diagram showing an example of MOS (metal oxide semiconductor) transistor used in the signal translating circuit shown in FIG. 3.

Now, the configuration of the MOS transistor used in the present invention will be described with reference to FIG. 4. In FIG. 4, on a P type substrate 11, an $N^+$ source region 12 and a drain region 13 are respectively formed. An $SiO_2$ layer 14 is formed on the surface of the region between the source region 12 and the drain region 13 on which a gate electrode 15 is deposited.

Therefore, in the MOS transistor thus made, a capacitor is formed at a portion 16 in which the gate electrode 15 and the source region 12 are opposed to each other to present capacity. Also when the gate potential is raised, a channel region 17 is formed between the source region 12 and the drain region 13. At this time, a capacitor is also formed between the gate electrode 15 and the channel region 17.

The above capacitor allows a bootstrap capacitive component to be constructed between the gate and the source of the transistor $M_{21}$ in the signal translating circuit of FIG. 3.

In the circuit shown in FIG. 3, the drain of the transistor $M_{21}$ is connected to the gate of a MOS transistor $M_{41}$ of enhancement type which forms a transmission gate. The source of the transistor $M_{21}$ is connected through the drain-source path of the transistor $M_{41}$ to the gate of a MOS transistor $M_{51}$ of enhancement type. A bootstrap capacitive component is formed between the gate and the source of the transistor $M_{51}$. The drain of the transistor $M_{51}$ is connected to the gate of a MOS transistor $M_{71}$ of enhancement type which forms a transmission gate. The source of the transistor $M_{51}$ is connected through the drainsource path of the transistor $M_{71}$ to the circuit of the succeeding state.

Further, MOS transistors $M_{31}$ and $M_{61}$ of enhancement type, each forming the transmission gate, are connected between the sources of the transistors $M_{21}$ and $M_{51}$ and the ground line 2. The sources of the succeeding transistors $M_{51}$ and $M_{22}$ are respectively connected through MOS transistors $M_{81}$ and $M_{91}$ of enhancement type, each being connected in a diode, to the gates of the transistors $M_{31}$ and $M_{61}$. The input sides of the preceding transistors $M_1$ and $M_{41}$ (which equal to the sources of the preceding transistors $M_{21}$, $M_{51}$ ... following the transistor $M_{41}$) are respectively connected to the gates of the MOS transistors $M_{a1}$ and $M_{b1}$ of enhancement type. These transistors $M_{a1}$ and $M_{b1}$ are respectively connected between the gates of the transistors $M_{31}$ and $M_{61}$ and the ground line 2.

The circuit formed of the transistors $M_{21}$ to $M_{b1}$ is repeatedly connected in turn.

Further, the clock terminal 4 is connected to the gate of the transistor $M_1$ and the drains of the transistors $M_{51}$, $M_{52}$ ..., while the clock terminal 5 is connected to the drains of the transistors $M_{21}$, $M_{22}$.

In this circuit, signals $\phi_1$, $\phi_2$ and $\phi_{IN}$ shown in FIGS. 5A, 5B and 5C (each of FIGS. 5A to 5Q is separated into the half for the sake of sheet of drawing as FIGS. 5A-1, 5A-2 and 5Q-1, 5Q-2.) are respectively supplied to the clock terminals 4 and 5 and the input terminal 1, respectively. In this case, the high level of the signals $\phi_1$, $\phi_2$ and $\phi_{IN}$ is represented as $V_H$, while the low level thereof is represented as $V_L$. Moreover, the pulses of the signals $\phi_1$ and $\phi_2$ are represented as [11], [12] ..., and [21], [22], .... The threshold values of the MOS transistors are all represented as $V_{th}$.

Thus, the signal $\phi_{IN}$ is transmitted through the transistor $M_1$ by the pulse [12] of the signal $\phi_1$ so that a voltage $V_1$ (shown in FIG. 5D) at the gate 1 of the transistor $M_{21}$ becomes as $$V_1 = V_H - V_{th} \tag{1}$$

Then, as regards a voltage $V_2$ (shown in FIG. 5E) at the source 2 of the transistor $M_{21}$, since the following condition $$V_1 - V_2 = V_H - V_L > V_{th} \tag{2}$$

is first established, the transistor M21 is turned on, resulting in $$V_2 = V_L \tag{3}$$

When the pulse [22] of the signal $\phi_2$ arrives, the voltage $V_1$ is boosted by bootstrap effect due to the capacitive component of the transistor $M_{21}$ and then becomes as $$V_1 = V_H + \frac{C_B}{C_B + C_S} V_H \tag{4}$$

where $C_B$ represents the bootstrap capacity and $C_S$ the stray capacity at the gate of the transistor $M_{21}$. At that time, if the condition of $$V_1 - V_{th} = V_H \tag{5}$$

is satisfied, the condition of $$V_2 = V_H \tag{6}$$

is established so that the pulse [22] is extracted to the source 2 of the transistor $M_{21}$.

Further, the transistor $M_{41}$ is turned on in synchronism with the clock signal $\phi_2$ so that the voltage $V_2$ is accumulated in the gate 3 of the transistor $M_{51}$. And, since a voltage $V_3$ (shown in FIG. 5F) at this gate 3 satisfies the condition expressed as $$V_3 = V_H - V_{th} \tag{7}$$

the transistor $M_{51}$ is turned on to thereby extract the pulse [13] at its source 4 in the same operation as in the transistor $M_{21}$ (as shown in FIG. 5G).

At that time, the pulse [13] extracted to the source 4 of the transistor $M_{51}$ is supplied through the transistor $M_{81}$ to the gate 5 of the transistor $M_{31}$, and so the charge based on this pulse [13] is accumulated in the gate 5 of the transistor $M_{31}$, thus the transistor $M_{31}$ being fixed in the onstate. Further, when the operation of the first period is completed and the signal $\phi_{IN}$ is supplied to the input terminal 1 at the beginning of the operation of the second period, the transistor $M_{a1}$ is turned on, the charge at the gate 5 of the transistor $M_{31}$ is reset and then the transistor $M_{31}$ is turned off.

Similarly, pulses [23], [14] ... of the signal $\phi_1$, $\phi_2$ are delivered to output points 7, 10 ... of the transistors $M_{22}$, $M_{52}$ ... (as shown in FIGS. 5J, 5M ...).

Therefore, in this circuit, the input signal $\phi_{IN}$ is sequentially transmitted and the pulses are sequentially produced at the sources of the transistors $M_{21}$, $M_{51}$, $M_{22}$, $M_{52}$, .... Then, the horizontal scanning lines, for example, can be driven in turn by these pulses.

In FIG. 5, the boosted voltage $V_A$ of the voltages $V_1$, $V_3$, $V_6$ ... is brought about by the bootstrap effect due to the capacitive components of the transistors $M_{21}$, $M_{51}$, ... and is expressed as $$V_A = \frac{C_B}{C_B + C_S} (V_H - V_L) \tag{8}$$

According to this circuit, the transistors $M_{31}$, $M_{61}$ ... are turned on by the output pulse of the succeeding stage and turned off by the signal from the preceding stage during the next period. In other words, since the transistors $M_{31}$, $M_{61}$ ... are turned on during the period other than the preceding and succeeding periods during which the output pulse is generated, the output terminal is connected to the ground line 2 during that period and hence the low potential level of the output signal is fixed to the ground potential.

As described above, the transmission of the input signal $\phi_{IN}$ is performed by the signal translating circuit of the present invention in which the aforesaid defects inherent in the conventional circuit can be removed.

More particularly, in the above circuit of the invention, one stage which transmits the signal and produces the succeeding signal is constructed by only five elements of, for example, the transistors $M_{21}$, $M_{31}$, $M_{41}$, $M_{81}$ and $M_{a1}$, resulting in the small-sized circuit and the small chip area when the circuit is formed as the integrated circuit.

Also, since the output signal is formed by extracting the pulses of the clock signals, the overlapped portion between the output signals can easily be removed by reducing the pulse width of the pulses of the clock signals $\phi_1$ and $\phi_2$ as set forth above.

Further, since the signal translating circuit according to the present invention has no through type current flowing therethrough unlike the prior art circuit, the power consumption can be reduced greatly.

Since each transistor is driven in the straight line region, the transistor can easily be driven at high speed. In this case, the power consumption is not increased thereby.

Further, since the output signal can be produced by the respective clock signals $\phi_1$ and $\phi_2$, the frequency of the clock signals can be reduced to one-half of that of the prior art to thereby reduce the power consumption further.

Moreover, the signal translating circuit according to the present invention can be formed of only the transistor elements of, for example, the enhancement type so that when the circuit is formed as the integrated circuit, the number of the manufacturing process can be reduced and the circuit can be formed with ease and at low manufacturing cost.

Furthermore, since the transistors $M_{31}$, $M_{61}$ are provided, the low potential level of the output signal is fixed to the ground potential, thus removing the undesired potential fluctuation on the output line. In this case, if the transistors $M_{31}$, $M_{61}$, . . . are not provided, the signal line from each output terminal to the CCD or liquid crystal display device driven thereby is placed in the floated state during the periods other than that of the output pulse. Thus, the above signal line is easily affected by external disturbance or the like and the potential fluctuation is caused thereon to thereby cause the CCD or liquid crystal display device to malfunction.

Figure 6:
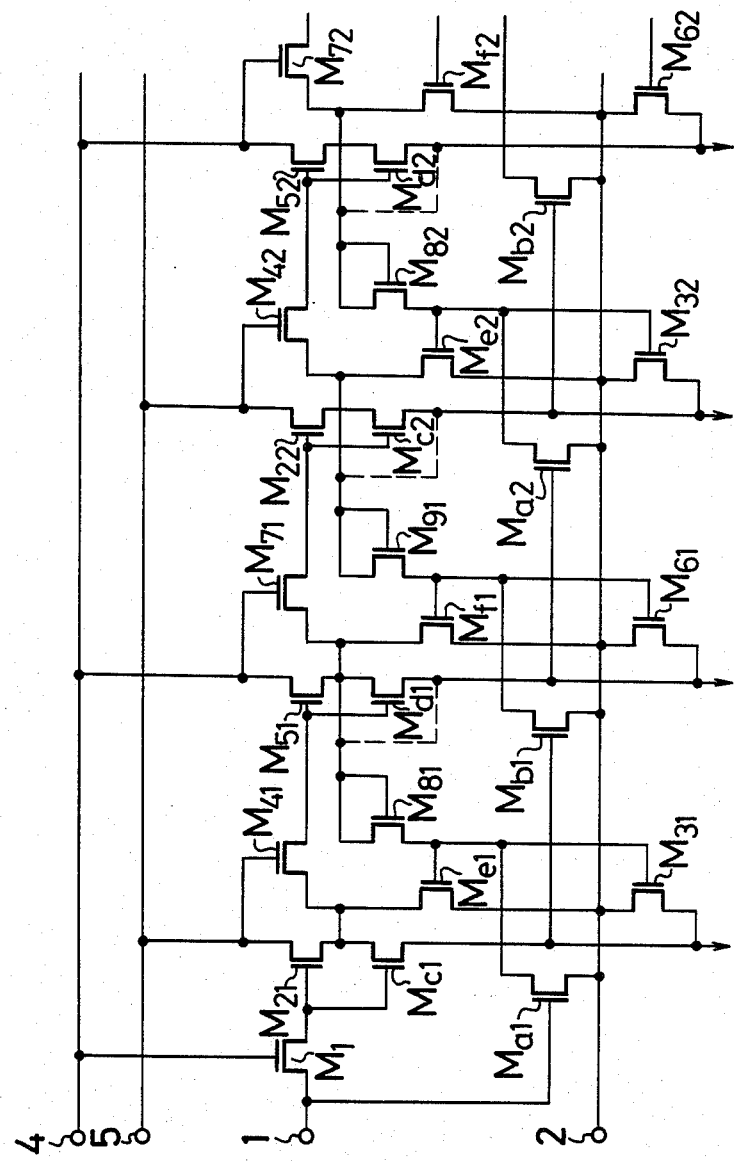
FIGS. 6 to 8 inclusive, are respectively connection diagrams showing other embodiments of the signal translating circuit according to the present invention.

FIG. 6 shows another embodiment of the signal translating circuit according to the present invention. In the example shown in FIG. 6, there are provided MOS transistors $M_{c1}$ and $M_{d1}$ of enhancement type, each forming a transmission gate, the gates of which are respectively connected to the gates of the transistors $M_{21}$ and $M_{51}$. These transistors $M_{c1}$ and $M_{d1}$ are connected to the sources of the transistors $M_{21}$ and $M_{51}$ through which the output signals are led out. Further, there are provided MOS transistors $M_{e1}$ and $M_{f1}$ of enhancement type, each forming a transmission gate, the gates of which are respectively connected to the gates of the transistors, $M_{31}$ and $M_{61}$. The source-drain paths of the transistors $M_{e1}$ and $M_{f1}$ are respectively connected between the connection points of the transistors $M_{21}$, $M_{c1}$ and $M_{51}$, $M_{d1}$ and the ground line 2.

According to this circuit, since the transistors $M_{c1}$, $M_{d1}$ . . . are turned on during only the period of the output pulse, the clock signals $\phi_1$ and $\phi_2$ are prevented from being leaked through the capacitive components of the transistors $M_{41}$, $M_{71}$ . . . to the output terminal. Moreover, since the transistors $M_{e1}$, $M_{f1}$ . . . are turned on at the same time with the transistors $M_{31}$, $M_{61}$ . . . , the charge fed back from the hot end side of the bootstrap is absorbed into the ground line 2 through the transistors $M_{e1}$, $M_{f1}$ . . . .

Thus, in this circuit, the potential fluctuation at the portion other than the output pulse in the period during which the transistors $M_{31}$, $M_{61}$ . . . are turned off is removed, resulting in more stable potential of the output line. In this case, the gates of the transistors $M_{81}$, $M_{91}$, . . . may be connected to anyone of the input and output sides of the transistors $M_{c1}$, $M_{d1}$ . . . .

Figure 7:
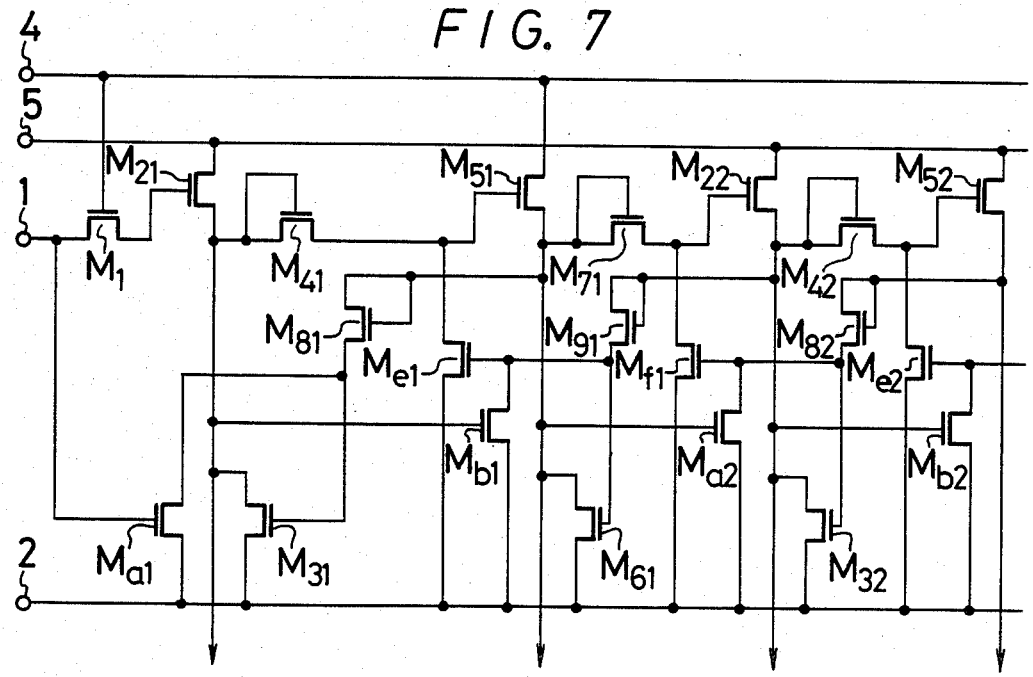

Further, FIG. 7 shows a further embodiment of the signal translating circuit according to the present invention. In the embodiment shown in FIG. 7, the transistors $M_{e1}$ and $M_{f1}$ shown in FIG. 6 are connected between the connection points of the transistors $M_{41}$, $M_{51}$ and $M_{71}$, $M_{22}$ and the ground line 2. In this case, if the transistors $M_{41}$ and $M_{71}$ are connected in diode, the same operation as described above can be carried out.

In this example, since the clock signal is not applied to the gates of the transistors $M_{41}$ and $M_{71}$, the clock signal is never leaked therethrough and hence the transistors $M_{e1}$ and $M_{d1}$ can be omitted.

Figure 8:
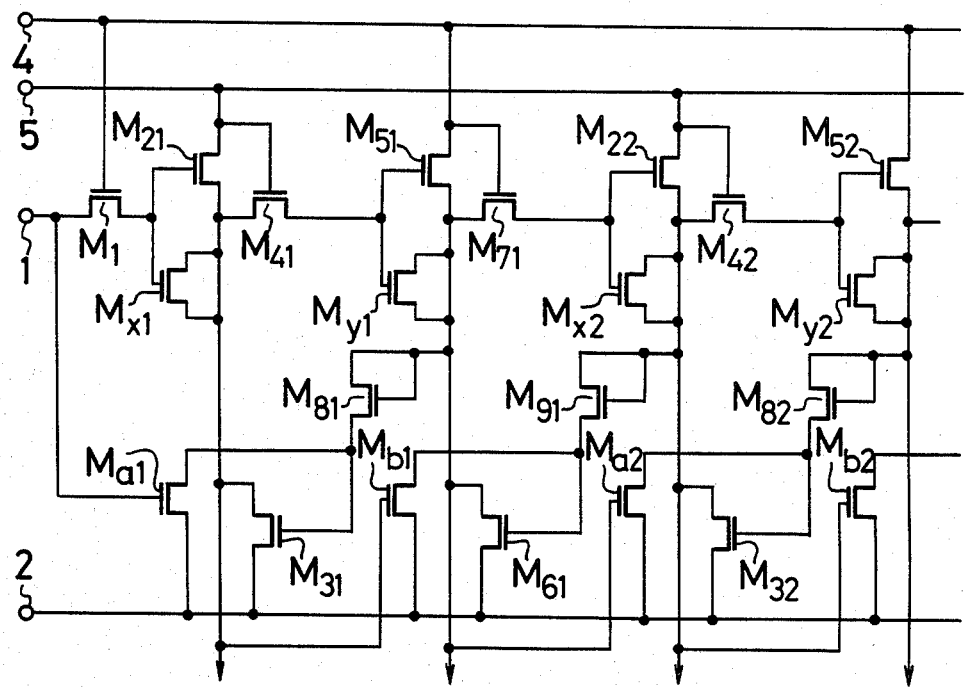

Furthermore, when the bootstrap capacitve component is insufficient by the MOS transistor, a capacitor may be connected between the source and gate of the transistor. As shown in FIG. 8, a capacity between the gate and the sourcedrain path of each of MOS transistors $M_{x1}$, $M_{y1}$ may be used as the capacitor in that case. The MOS transistors $M_{x1}$, $M_{y1}$ . . . may be formed as either of enhancement type and depletion type. While FIG. 8 shows the case that the MOS transistors $M_{x1}$, $M_{y1}$ . . . are applied to the signal translating circuit shown in FIG. 3, the MOS transistors $M_{x1}$, $M_{y1}$ . . . can similarly be applied to the signal translating circuits shown in FIGS. 6 and 7.

As described above, according to the present invention, it is possible to remove the undesired potential fluctuation except the output pulse of the output line.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. A signal translating circuit for generating plural pulse outputs in positions that are shifted time sequentially, said signal translating circuit comprising:

an input terminal supplied with an input signal;

first and second clock terminals supplied with first and second clock signals, respectively, said first and second clock signals having different phases from each other;

plural translating stages connected in series to said input terminal, each stage including a source follower transistor having a gate, a source and a drain, said drain being connected to one of said first and second clock terminals, and a bootstrap capacitor formed between said gate and source; and a transmission gate transistor having a gate, a source and a drain, the drain of said transmission gate transistor being connected to the source of said source follower transistor, the gate of said transmission gate transistor being connected to receive an enabling potential, and the source of said transmission gate transistor being connected to the gate of the source follower transistor of a succeeding stage;

plural output terminals where said plural pulse outputs appear, said output terminals being respectively connected to the sources of the source follower transistors;

means for connecting said first clock terminal to the drains of said source follower transistors of alternate stages and for connecting said second clock terminal to the drains of said source follower transistors of the remaining stages;

a switching device connected between each output terminal and ground and actuating means in each stage for turning on said switching device, said actuating means receiving the pulse output of the succeeding output terminal and generating a control signal in response thereto for turning on said switching device; and reset means in each stage for resetting said control signal, said reset means being controlled by the pulse output of the preceding output terminal.

2. A signal translating circuit according to claim 1, wherein the gate of the transmission gate transistor is connected to the drain of the source follower transistor, whereby said transmission gate transistor is controlled by one of said first and second clock signals.

3. A signal translating circuit according to claim 1, wherein said capacitor is a parasitic capacitor formed between the source and gate of said source follower transistor.

4. A signal translating circuit according to claim 2, further comprising a gate transistor in each stage connected between the source of said source follower transistor and the output terminal, said gate transistor being controlled by the signal at the gate of said source follower transistor.

5. A signal translating circuit according to claim 1, wherein in each stage the gate of said transmission gate transistor is connected to its drain and thereby said transmission gate transistor is operated as a unidirectional conducting device.

* * * * *